US011507017B2

(12) United States Patent
Shen

(10) Patent No.: US 11,507,017 B2
(45) **Date of Patent: *Nov. 22, 2022**

(54) PACKAGE ASPECT OF HEAT-DISSIPATING LID AND RESERVOIR STRUCTURE FOR LIQUID THERMAL INTERFACING MATERIALS

(71) Applicant: Yuci Shen, San Jose, CA (US)

(72) Inventor: Yuci Shen, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/794,652

(22) Filed: Feb. 19, 2020

(65) Prior Publication Data

US 2020/0183323 A1 Jun. 11, 2020

Related U.S. Application Data

(62) Division of application No. 16/400,999, filed on May 1, 2019, now Pat. No. 10,656,594.

(51) Int. Cl.

*H01L 23/34* (2006.01)
*G03G 21/18* (2006.01)
*G03G 21/16* (2006.01)

(52) U.S. Cl.

CPC ....... *G03G 21/185* (2013.01); *G03G 21/1666* (2013.01)

(58) Field of Classification Search

CPC ... H01L 23/34; H01L 23/42; H01L 2924/161; H01L 2924/1611; H01L 2924/1615
USPC .......................................... 257/712–714, 704
See application file for complete search history.

(56) References Cited

U.S. PATENT DOCUMENTS 6,351,384 B1 * 2/2002 Daikoku ................. F28F 13/12 361/689
7,435,623 B2 * 10/2008 Chrysler ............... H01L 23/473 257/E23.098
7,808,781 B2 * 10/2010 Colgan ................. H01L 23/473 165/104.33
10,170,392 B2 * 1/2019 Chainer ................ H01L 23/473
2005/0128705 A1 * 6/2005 Chu ...................... H01L 23/473 361/689
2006/0118925 A1 * 6/2006 Macris .................. H01L 23/433 257/667
2007/0040267 A1 * 2/2007 Zhao ..................... H01L 23/433 257/706
2007/0127211 A1 * 6/2007 Macris .................... H01L 23/42 361/700
2009/0234705 A1 * 9/2009 Brunschwiler ......... G06F 1/206 361/679.53
2009/0283244 A1 * 11/2009 Bezama ................ H01L 23/473 165/80.4
2010/0096747 A1 * 4/2010 Kusano ............ H01L 23/49816 257/706

(Continued)

*Primary Examiner* — Nitin Parekh

(57) ABSTRACT

The disclosure describes a heat-dissipating object having a reservoir structure so that a reservoir system can be formed in an electronic device, allowing for a liquid TIM in the gap between the heat-dissipating object and the heat-generating object of the electronic device. The reservoir structure comprises a seal ring, a connecting hole and a reservoir which is a space for taking in a liquid material and releasing it again when needed. As a specific case of the heat-dissipating object and the electronic device, a lid having a reservoir structure and a lidded flip chip package based on the lid are particularly described in details of the embodiments of the present invention.

13 Claims, 17 Drawing Sheets

(56) References Cited

U.S. PATENT DOCUMENTS

2015/0221625 A1* 8/2015 Chun .................... H01L 23/367
257/707

* cited by examiner

PACKAGE ASPECT OF HEAT-DISSIPATING LID AND RESERVOIR STRUCTURE FOR LIQUID THERMAL INTERFACING MATERIALS

TECHNICAL FIELD OF THE DISCLOSURE

The present application is a divisional application of U.S. patent application Ser. No. 16/400,666, filed May, 1, 2019.

The disclosure relates generally to a heat-dissipating object for dissipating heat from a heat-generating object in an electronic device, and particularly to a lid for a lidded flip chip package to use a liquid thermal interface material (TIM).

BACKGROUND OF THE DISCLOSURE

In a flip chip package with a semiconductor chip being a heat-generating object, a thermal interface material (TIM) is usually used to fill the gap between the flip chip and a heat-dissipating object, like a lid or a heat sink for transferring the heat from one to the other. The types of the TIM basically include thermal pad, thermal grease, phase change material and liquid metal. A good TIM needs to have 1) a high thermal conductivity, 2) a good surface wetting capability for reducing the thermal contact resistance, 3) a good gap filling capability, and 4) a good thermal reliability in test or application. A liquid metal as TIM usually includes gallium and gallium alloy. The melting point of the gallium is about 29° C., and that of gallium alloy is even lower. The thermal conductivity of the liquid metal is much higher than the extensively used thermal pad or thermal grease. Furthermore, a liquid metal has much better capability for surface wetting and gap filling. So, of all the types of TIM, a liquid metal is an ideal TIM if only looking at the first three items. If a liquid metal can be used in a lidded flip chip package, the temperature of the lidded flip chip package can be reduced significantly as compared to other types of TIM. However, the conventional lidded flip chip packages based on a conventional lid of prior arts are limited to use a liquid metal as its TIM due to the pumping-out issue, that is, when the package is under a thermal cycling test or in its long term of application, the volume of the gap between the flip chip and the lid varies with temperature due to the warpage of the flip chip, causing the liquid metal TIM to be pumped out. The TIM pumping-out issue will cause an incomplete gap filling between the flip chip and the lid, reducing the thermal performance of TIM. And the more important thing is that because a liquid metal is electrically conductive, a small amount of TIM pumping-out may damage the whole electronic device. As a result, a liquid metal type of TIM has not been commercially used in a lidded flip chip package. In general, because of the similar reason, a liquid metal type of TIM is rarely interposed between a heat-dissipating object (a heat sink, for example) and a heat-generating object (a semiconductor chip, for example) in an electronic device.

SUMMARY OF THE DISCLOSURE

For overcoming the TIM pumping-out issue for an electronic device such as a lidded flip chip package to use a liquid TIM, a heat-dissipating object coupled with a reservoir structure is described in the present disclosure, which is summarized below.

A heat-dissipating object allowing for a liquid TIM in an electronic device, comprising: a base plate having a top and a bottom surface, and a reservoir structure, comprising a reservoir, a seal ring and a connecting hole, wherein the reservoir is a space for taking in a liquid material and releasing it again when needed, the seal ring is an elastic-type ring mounted on the bottom surface of the base plate, and the connecting hole starts from the seal ring region of bottom surface of the base plate and connects to the reservoir. In particular, the heat-dissipating object is a lid for a lidded flip chip package to use a liquid TIM.

A lidded flip chip package with a liquid TIM, comprising: a flip chip package consisting of an edged flip chip attached on a substrate, a lid having a reservoir structure, and a reservoir system based on the reservoir structure of the lid; wherein the lid is attached on/in/to the substrate, therein covering the flip chip, the reservoir structure of the lid comprises a reservoir, a seal ring and a connecting hole, the reservoir is a space for taking in a liquid material and releasing it again when needed, the seal ring is an elastic-type ring mounted on the bottom surface of the lid, and the connecting hole starts from the seal ring region of bottom surface of the lid and connects to the reservoir; and wherein the reservoir system comprises the reservoir of the lid, the connecting hole of the lid, a sealed gap, and a liquid material; the seal ring of the reservoir structure of the lid seals the gap between the lid and the flip chip at the edge region of the flip chip, forming the sealed gap, the connecting hole is between the sealed gap and the reservoir for connecting the sealed gap with the reservoir, and the liquid material is filled in the sealed gap and the reservoir.

The features and advantages of the embodiments of the present disclosure will become more apparent from the detailed descriptions in conjunction with the drawings below. The drawings and associated descriptions are to illustrate the embodiments of the present disclosure, not to limit the scope of what is claimed.

DETAILED DESCRIPTION OF THE PREFERRED EMBODIMENT

Figure 1:
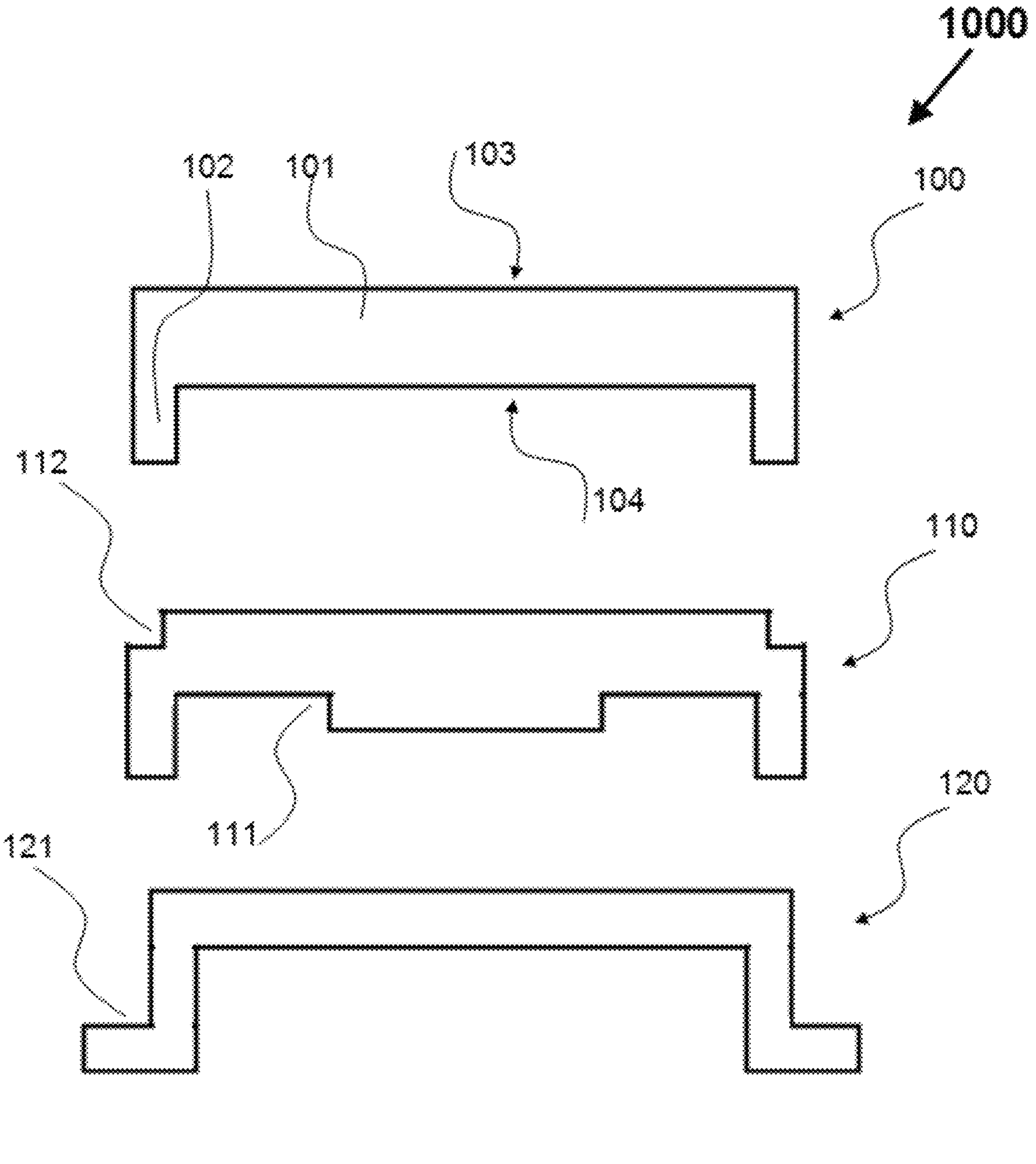
FIG. 1 is a schematic diagram for illustrating a conventional lid used in a lidded flip chip package of prior arts.
Figure 2:
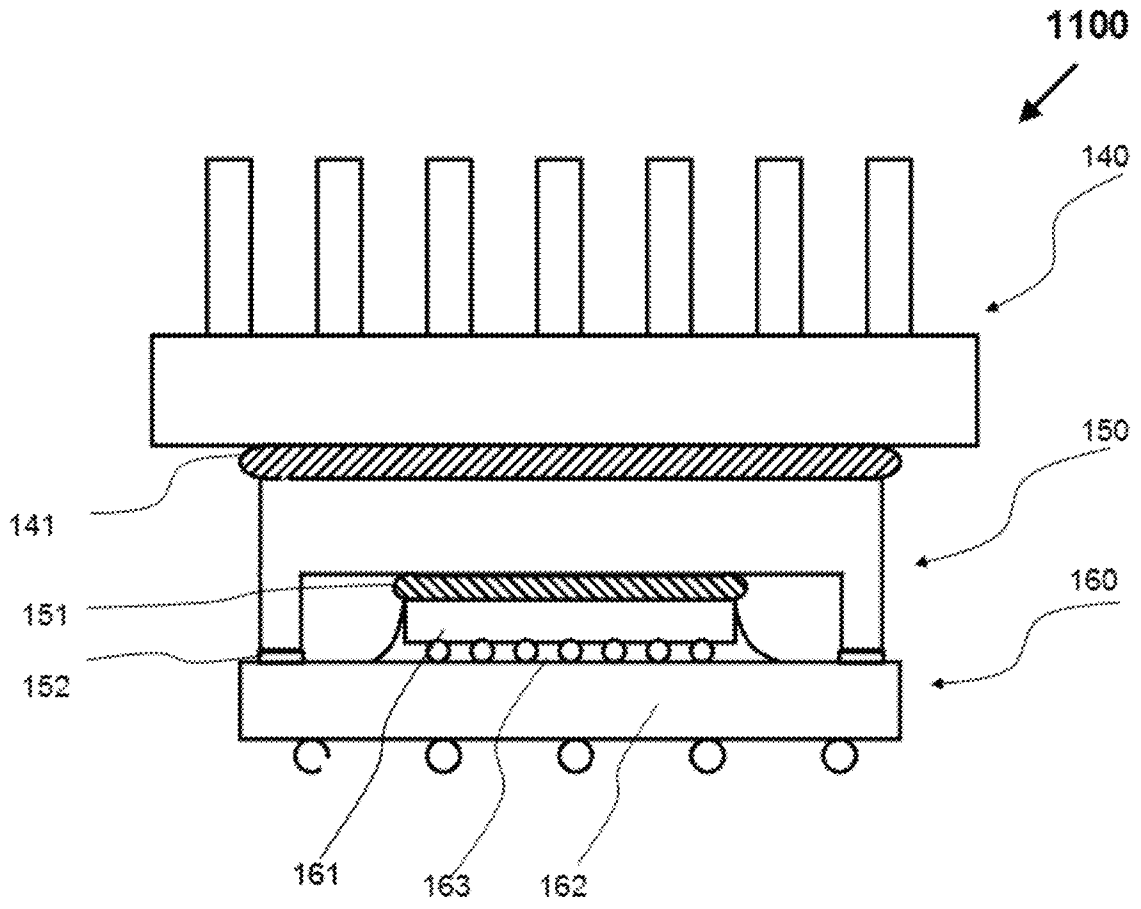
FIG. 2 is a schematic diagram for illustrating a lidded flip chip package of prior arts.

FIG. 1 and FIG. 2 are used to explain some terms associated with a lid, a lidded flip chip package and a thermal interface material (TIM), and to describe the challenges about using a liquid TIM in a lidded flip chip package of prior arts.

FIG. 1 is a schematic diagram for illustrating a conventional lid used for a lidded flip chip package. The numerical symbol 1000 in FIG. 1 designates some examples of conventional lids, in which the numerical symbol 100 designates a conventional lid, consisting of a top piece 101 and a side wall 102, 110 designates a conventional lid, further including the step of structures 111 and 112 for a specific application, and 120 designates a conventional hat type of lid, in which the side wall further includes the foot 121. The terms of the top and bottom surfaces of a lid is explained by the numerical symbol 103 and 104 in the lid 100. Most of the conventional lids for a lidded flip chip package are made from copper by using a stamping or machining manufacture process. A hat type of lid is usually for a thin lid, and a stamping manufacture process is used for it. All these conventional lids don't have any essential difference, and basically comprise a top piece and a side wall.

FIG. 2 is a schematic diagram for illustrating a conventional lidded flip chip package and its heat-dissipating way through a heat sink. The numerical symbol 1100 in FIG. 2 designates a conventional lidded flip chip package attached with a heat sink, in which the numerical symbol 140, 150 and 160 respectively designate a heat sink, a lid and a flip chip package. The flip chip package 160 consists of a flip chip 161 and a substrate 162, in which the flip chip 161 is attached on the middle region of top surface of the substrate 162 through a layer of bumps and underfill material 163. It is noted that for simplicity and clarity, the numerical symbol 160 is kept the same to designate a flip chip package in the drawings through the description of the present disclosure. The conventional lidded flip chip package is formed by attaching the lid 150 to the flip chip package 160, in which the lid 150 is attached on the peripheral region of top surface of the substrate 162 through a layer of adhesive material 152, covering the flip chip 161, and a TIM 151 is applied to fill the gap between the flip chip 161 and the lid 150. The heat sink 140 is attached on the top surface of the lid 150 for dissipating the heat generated by the flip chip 161 to the ambient. A TIM 141 is applied to fill the gap between the lid 150 and the heat sink 140. The TIM 151 and 141 are usually called TIM1 and TIM2. For TIM1 151, a liquid TIM is not commercially used because of its pumping-out issue under thermal cycling condition. For TIM2, a grease type of TIM or a thermal pad type of TIM is usually used, but a liquid type of TIM is rarely used because of the same reason. It is noted that the flip chip 161 is not always flat, but warps with temperature due to its CTE (coefficient of thermal expansion) mismatch with the substrate 162, causing the volume change of the gap between the flip chip 161 and the lid 150. As a result, a liquid TIM is easy to be pumped out, causing a challenge for a conventional lidded flip chip package to use a liquid TIM.

Figure 3:
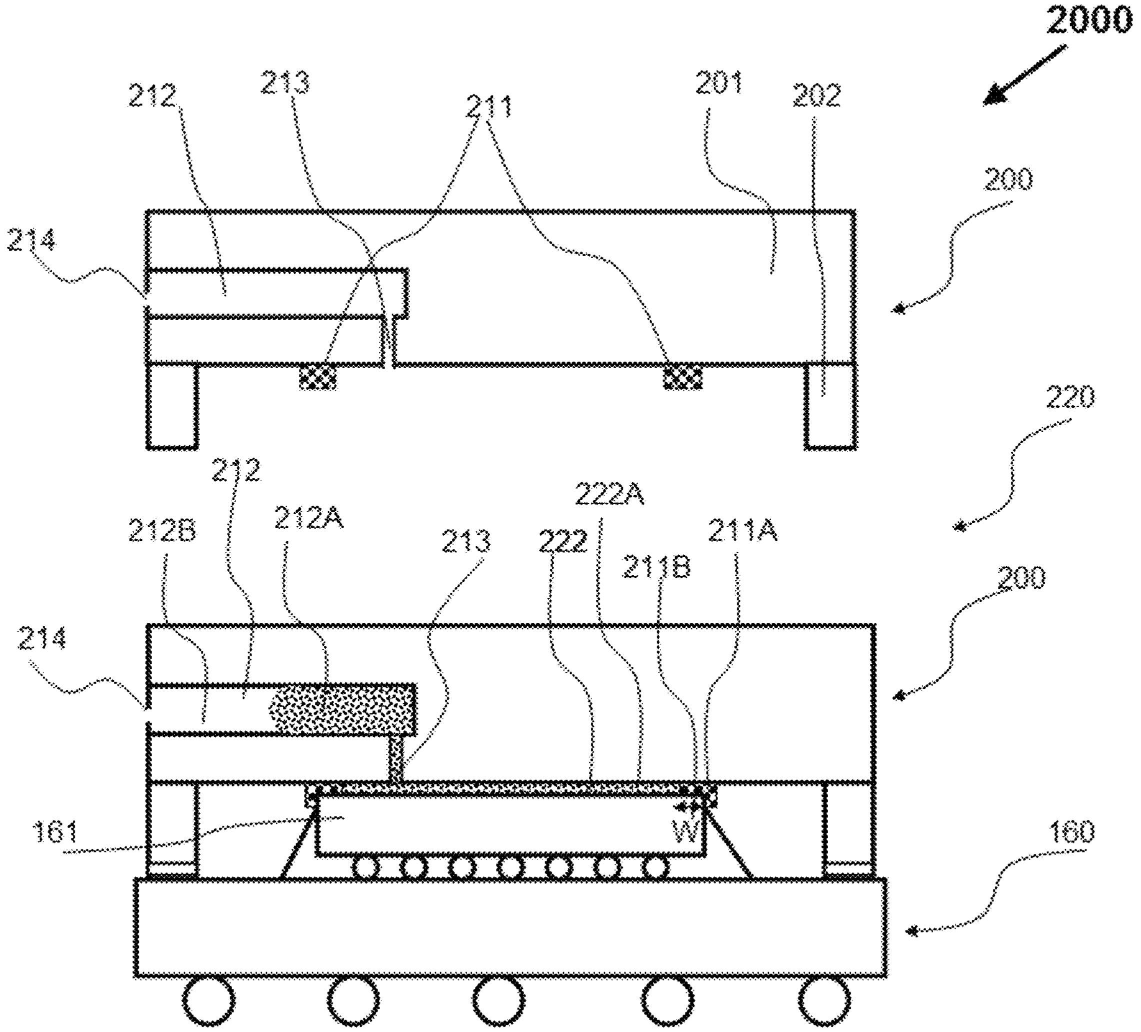
FIG. 3 is a schematic diagram for illustrating the basic ideal and features of a lid for a lidded flip chip package to use a liquid TIM of the present invention.

FIG. 3 is a schematic diagram for illustrating the basic ideal and features of a lid for a lidded flip chip package to use a liquid TIM of the present invention. The numerical symbol 2000 in FIG. 3 designates a lid 200 and a lidded flip chip package 220 based on the lid, wherein the lid includes a reservoir structure, and the lidded flip chip package 220 includes a reservoir system based on the reservoir structure, deviating them from the conventional ones. In additional to the top piece 201 and side wall 202, the present lid 200 includes a reservoir structure, consisting of a seal ring 211 mounted on its bottom surface, a reservoir 212 outside the seal ring region of bottom surface of the lid, and a connecting hole 213, starting from the seal ring region of bottom surface of the lid and connecting to the reservoir. Some terns and concepts are explained with reference to FIG. 3 for clarity. The end of the connecting hole at the bottom surface of the lid is called an inner end and the other end of the connecting hole is called an outer end. The seal ring region of bottom surface of the lid means the portion of the bottom surface of the lid surrounded by the seal ring. The reservoir 212 in the present disclosure means a space for taking in a liquid material and releasing it again when needed, which may be a cavity inside the lid as that in the example or a container outside the lid. The 214 designates an outlet of the reservoir 212, which opens to the ambient, and its inlet connects with the outer end of the connecting hole 213.

Referring to FIG. 3, after attaching the lid 200 onto the flip chip package 160, the lidded flip chip package 220 of the present disclosure is formed, wherein the lidded flip chip package 220 includes a reservoir system based on the reservoir structure of the lid 200, which consists of the reservoir 212 of the lid, the connecting hole 213 of the lid, a sealed gap 222, and a liquid material 222A/212A, the gap between the lid 220 and the flip chip 161 is sealed at the edge region of the flip chip 161 by the seal ring 211A, forming the sealed gap 222, the reservoir 212 is a cavity in the top piece of the lid in the example, which is generally a space outside the sealed gap 222, the connecting hole 213 is between the sealed gap 222 and the reservoir 212 for connecting one with the other, and a liquid material is fully filled in the sealed gap 222, and partially filled in the reservoir. The 222A and 212A respectively designate the liquid material in the gap 222 and reservoir 212, and the 212B designates the empty space in the reservoir 212. The liquid material 222A forms a liquid TIM between the flip chip 161 and lid 220. It is seen that when the volume of the sealed gap 222 gets smaller, the reservoir 212 can take in the excessive amount of liquid material from the sealed gap 222 to its empty space 212B, keeping the pressure inside the sealed gap 222 not to be high, and when the volume of the sealed gap 222 gets larger, the reservoir 212 can release the needed amount of liquid material into the sealed gap 222 from its stored liquid material 212A, keeping the sealed gap 222 to be fully filled.

It is noted that the reservoir 212 needs to have an outlet designated by 214 as showed in FIG. 3 to be opened to the ambient so that the liquid material can be taken in and released from and to the sealed gap 222 when needed. And it is also noted that if a lidded flip chip package only uses a sealed gap through a seal ring for adopting a liquid TIM, the sealed gap will not be fully filled when the volume of the sealed gap gets larger, and the pressure in the sealed gap will become high when the volume of the sealed gap gets smaller, breaking the seal ring. And it is further noted that the seal ring 211 is an elastic-type ring and a rubber-like material is preferred for making it so that the seal ring 211 can be tightly compressed onto the edge region of the flip chip 161 when assembling the lid 200 with the flip chip package 160, as showed by the seal ring 211A in the present lidded flip chip package 220, in which the seal ring 211A is at compression state as compared to its original state as showed by 211 in the lid 200. And it is further noted that the edge region of the flip chip 161 is covered by the seal ring 211A. Because the thermal conductivity of a rubber-like material which is preferred for the seal ring 211A is low, the width as designated by the numerical symbol 212B of the edge region of the flip chip 161 needs to be optimized according to both reliability and thermal consideration. A width value from 0.2 mm to 1 mm is preferred.

Figure 4:
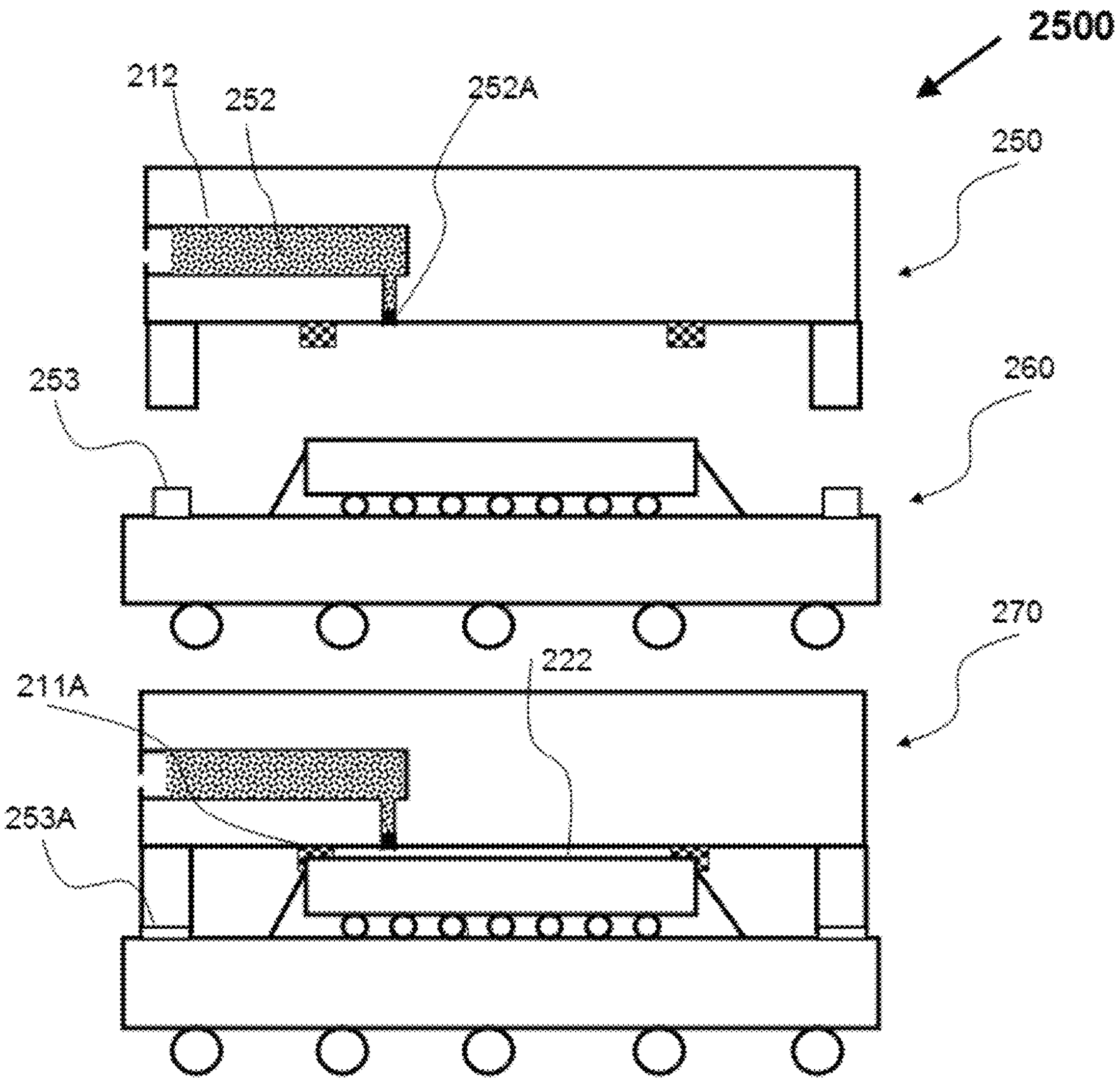
FIG. 4 is a schematic diagram for illustrating a way for using the present lid to form a lidded flip chip package with a liquid TIM of one embodiment of the present invention.

Referring to FIG. 3, a challenge to form the present lidded flip chip package 220 based on the lid 200 is for a liquid material to be fully filled in the sealed gap 222, and partially filled in the reservoir 212 without air trapped in the sealed gap 222. FIG. 4 is a schematic diagram for illustrating a way to form the lidded flip chip package 220 based on the lid 200 of one embodiment of the present invention, in which the numerical symbol 250 designates that the lid 200 as showed in FIG. 3 further includes a liquid material 252 pre-stored in its reservoir 212, and a low melting point of seal material 252A is used to seal the inner end of the connecting hole so that the liquid material 252 is held in place before the application of the lid, the 260 designates that an adhesive material 253 has been dispensed on the peripheral region of the substrate of the flip chip package for bonding the lid with the substrate, and the 270 designates that the lid 250 is attached onto the substrate in a vacuum condition and under a compression force so that the gap 222 becomes a vacuum gap tightly sealed by the seal ring 211A and the adhesive material 253 has extended into an adhesive layer 253A. Then, the assembly 270 is arranged to go through a curing process for curing the adhesive layer 253A in a high temperature and an ambient condition. Because the curing temperature is usually around 150° C. for about 1 hour or longer, the low melting point of seal material 252A for sealing the inner end of the connecting hole gets melted, and the connecting hole gets opened. As a result, the liquid material 252 is sucked into the sealed gap 222 due to the lower pressure in it as compared to the ambient pressure, forming the lidded flip chip package 220 with a liquid TIM as showed in FIG. 3. It is noted that for the way to form the present lidded flip chip package 220 as showed in FIG. 4, a liquid material of gallium alloy with melting point below room temperature and indium alloy material with melting point from 60° C. to 100° C. are preferred for the liquid material 252 and seal material 252A, respectively. It is also noted that the pure gallium can be selected for the liquid material 252 without using the seal material 252A. But before the application of the lid, the lid with the gallium 252 pre-stored in its reservoir 212 needs to be kept below 29.8° C., the melting point of the gallium so that the gallium 252 is in solid state without the concern of its leakage.

It is noted that the reservoir 212 of the lid 200 and its corresponding lidded flip chip package 222 as showed in FIG. 3 can be flexibly designed according to a specific application. A tunnel type of reservoir is preferred in the embodiments of the present disclosure so that air can be prevented from being trapped in the sealed gap 222. FIG. 5 to FIG. 13 are schematic diagrams for illustrating some tunnel type of reservoirs of the lid and lidded flip chip package of the preferred embodiments of the present disclosure. The preferred reservoirs include a pattern of tunnel based on a pattern of slots on the top or bottom surface of the top piece of the lid, a pattern of tunnel in the middle layer of the top piece of the lid, and a tube type of container outside the top piece of the lid, which will be described in conjunction with their drawings in the following.

Figure 5:
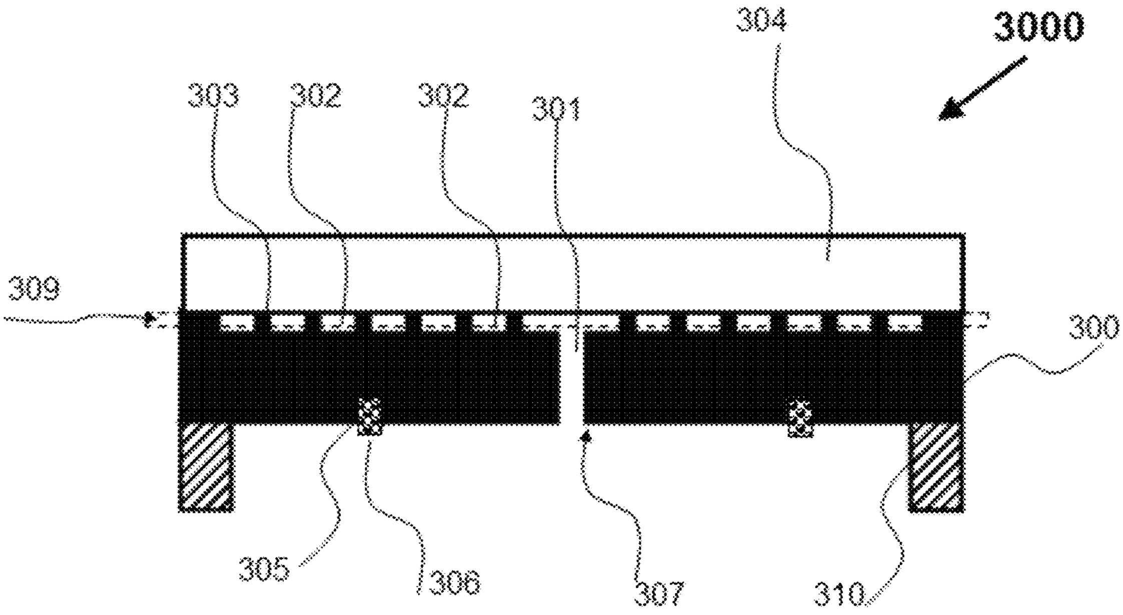
FIG. 5, FIG. 5A and FIG. 5B are schematic diagrams for illustrating a lid having a reservoir on its top surface from its cross-sectional, top and bottom views of one preferred embodiment of the present invention.
Figure 5A:
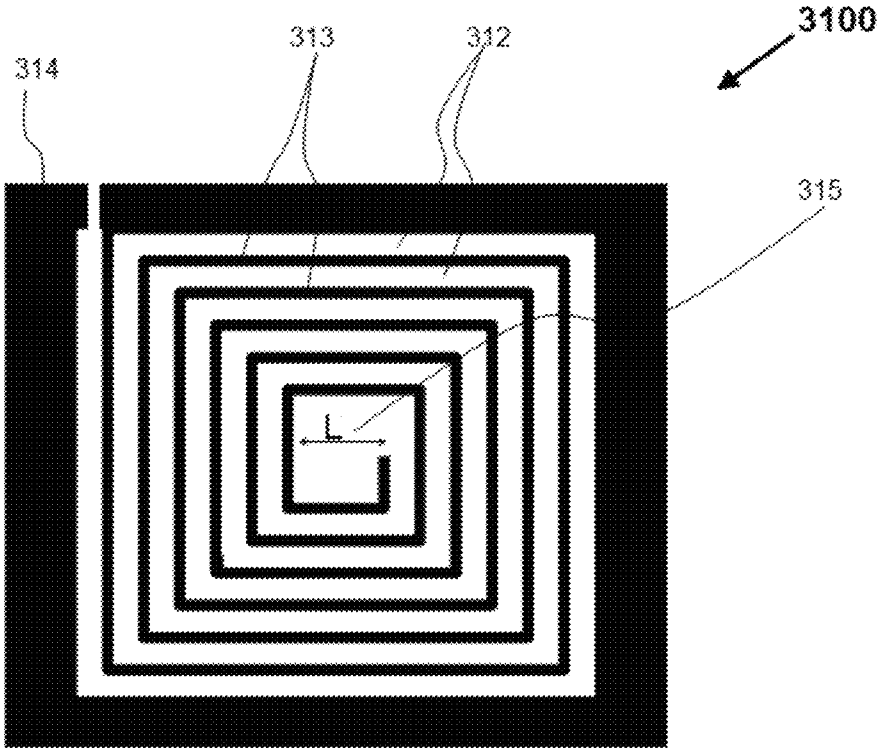
Figure 5B:
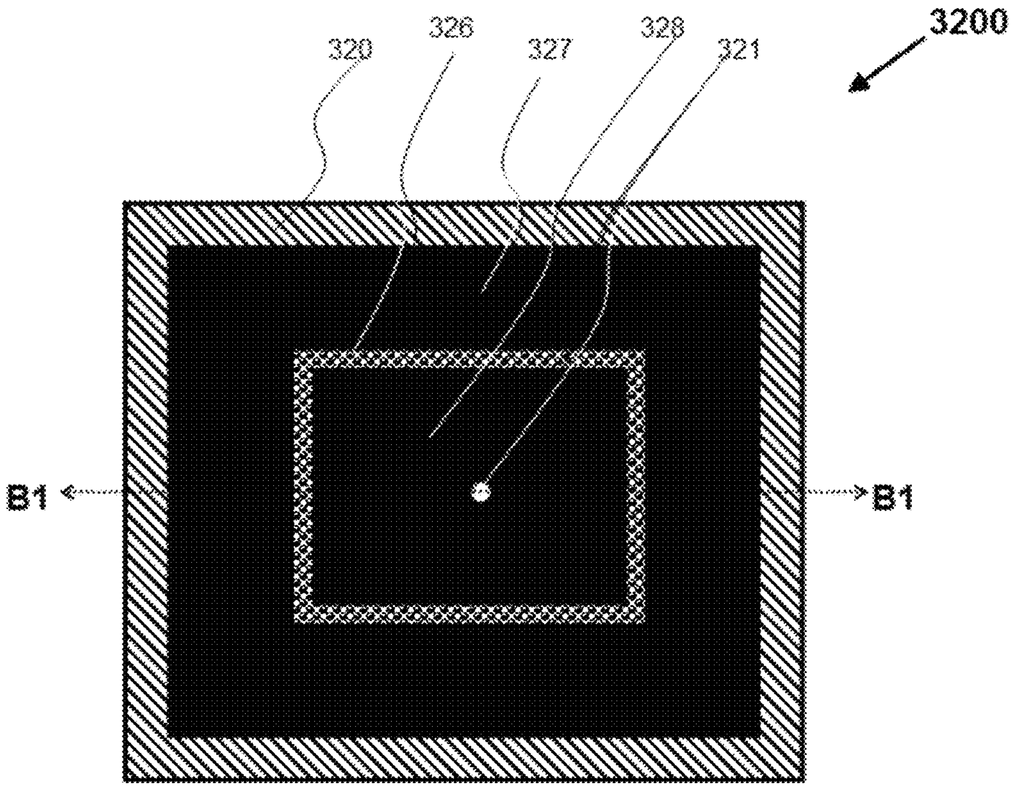

FIG. 5, FIG. 5A and FIG. 5B are schematic diagrams for illustrating a lid from its cross-sectional, top and bottom views of one preferred embodiment of the present invention, in which the reservoir of the lid is a pattern of tunnel based on a pattern of slots on the top surface of the top piece of the lid, and the pattern of slot is particularly a spiral pattern of slot. The numerical symbol 3000 in FIG. 5 designates the cross-sectional view of the lid, in which the 300 and 310 respectively designate its top piece and side wall, the 305 and 306 respectively designate a ring-type of slot on its bottom surface and a seal ring mounted in the ring-type of slot 305, the ring-type of slot 305 is for keeping the seal ring in place, 302 designates a spiral pattern of slot for a reservoir on the top surface of the lid, 301 designate a connecting hole, going through the top piece 300, 307 indicates that the connecting hole 301 starts from the seal ring region of bottom surface of the lid and connects to the spiral pattern of slot 302, the 309 designates the material layer in the rectangular dash line region, called a reservoir layer herein, which will be described from its top view for further clarifying the reservoir, and the 304 designates a removable covering piece, which covers the spiral pattern of slot 302, forming a spiral pattern of tunnel. The numerical symbol 3100 in FIG. 5A designates the top view of the reservoir layer 309 as showed in FIG. 5, in which the 312 designates the spiral pattern of slot 302 from its top view, 314 and 313 designate the materials of the reservoir layer 309 around and among the spiral pattern of slot 312, and the letter L indicated by 315 designates the size of the central opening of the spiral pattern of slot 312. The numerical symbol 3200 in FIG. 5B designates the bottom view of the lid, in which the 320 designates the side wall 310 in FIG. 5 from its bottom view, 321 designates the connecting hole 301 in FIG. 5 from its bottom view, 326 designates the seal ring 306 in FIG. 5 from its bottom view, the 327 and 328 designate the portions of the bottom surface of the lid outside and inside the seal ring 326, the portion of the bottom surface of the lid inside the seal ring 328 is called the seal ring region of bottom surface of the lid herein, the arrow dash line B1 to B1 designates the cross-sectional location for the cross-sectional view of the lid in FIG. 5.

It is noted that the reservoir layer 309 as showed in FIG. 5/5A is designable in its material and geometrical structure, and that a reservoir formed in a reservoir layer is preferred in the embodiments of the present disclosure. Some other variations for the reservoir layer 309 are described in conjunction with the drawings in FIG. 6 to FIG. 7 in the following. It is also noted that the purpose for the lid 3000 to have the removable covering piece 304 as showed in FIG. 5 will be explained in conjunction with the drawing of a lidded flip chip package using the lid in FIG. 8/8A below.

Figure 6:
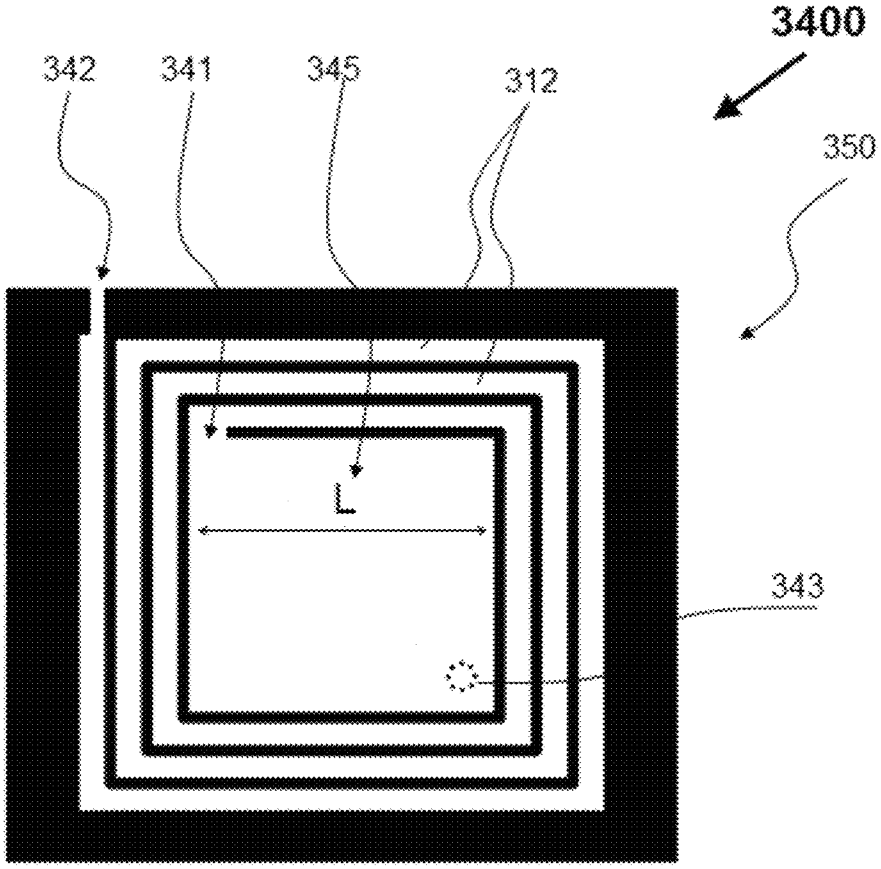
FIG. 6 and FIG. 6A are schematic diagrams for illustrating some variations for the reservoir on the top surface of a lid from its cross-sectional and top views of another preferred embodiment of the present invention.
Figure 6A:
Figure 7:
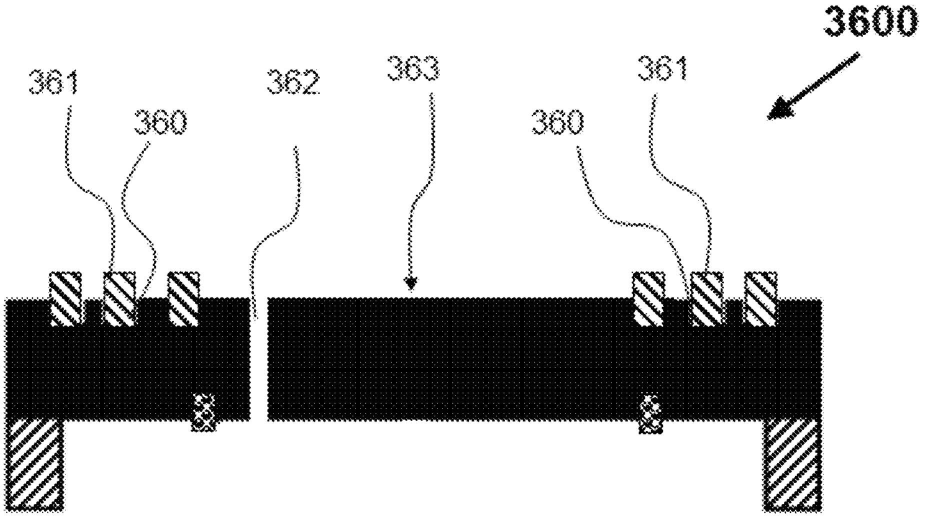
FIG. 7 and FIG. 7A are schematic diagrams for illustrating a reservoir on the top surface of a lid from its cross-sectional and top views of another preferred embodiment of the present invention.
Figure 7A:
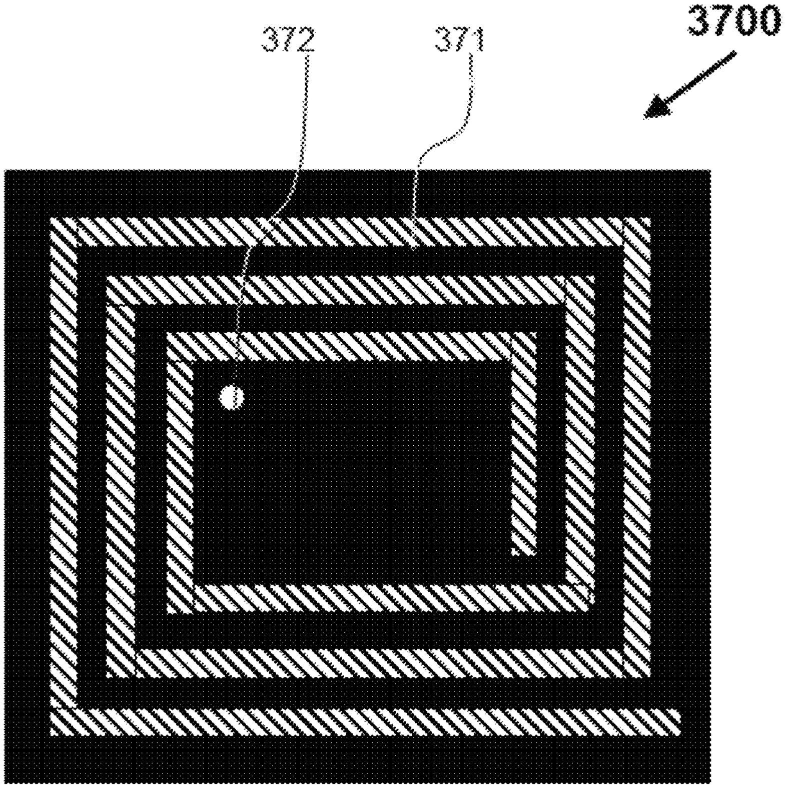

FIG. 6 and FIG. 6A are schematic diagrams for illustrating some variations in material and geometry for the reservoir layer 309 as showed in FIG. 5 and FIG. 5A of one preferred embodiment of the present invention. The numerical symbol 3400 in FIG. 6 designates the top view of a reservoir layer 350, in which the arrow line with letter L designated by the 345 illustrates that the spiral pattern of slot 312 has a bigger central opening as compared to that in FIG. 5A, the 341 and 342 designate the inlet and outlet of the spiral pattern of slot 312, the 343 illustrates that the connecting hole 301/321 in FIG. 5 and FIG. 5A is accordingly re-positioned at the opposite corner from the inlet 341 in the central opening of the spiral pattern of slot 312. The numerical symbol 3500 in FIG. 6A designates the cross-sectional view of a lid with the reservoir layer 350 as showed in FIG. 6, in which a layer of different material from the top piece of the lid is used for forming the reservoir layer 350. It is noted that a layer of different material having a pattern of slots can be printed on the top surface of the lid to form a reservoir layer. FIG. 7 and FIG. 7A are schematic diagrams for illustrating a lid with a reservoir layer of another preferred embodiment of the present invention. The numerical symbol 3600 in FIG. 7 designates the cross-sectional view of the lid, in which the 361 designates a spiral pattern of thread arranged in a spiral pattern of slot on the top surface 363 of the lid, and the 362 designates a connecting hole through the top piece of the lid. It is noted that the spiral pattern of thread 361 forms a reservoir layer, and the gaps among the spiral pattern of thread 361 forms a reservoir of the lid for storing or providing a liquid material. The numerical symbol 3700 in FIG. 7A designates the top view of the lid, in which the 371 and 372 designates the spiral pattern of thread 361 and connecting hole 362 in FIG. 7 from their top views.

It is noted that it has some specific benefits to use a layer of different material to make a reservoir layer on the top surface of the lid. For example, a rubber-like material can be selected to form the spiral pattern of thread 361 for the reservoir layer of the lid as showed in FIG. 6, and a layer of different material with a specific pattern of opening can be printed on the top surface of the lid.

Figure 8:
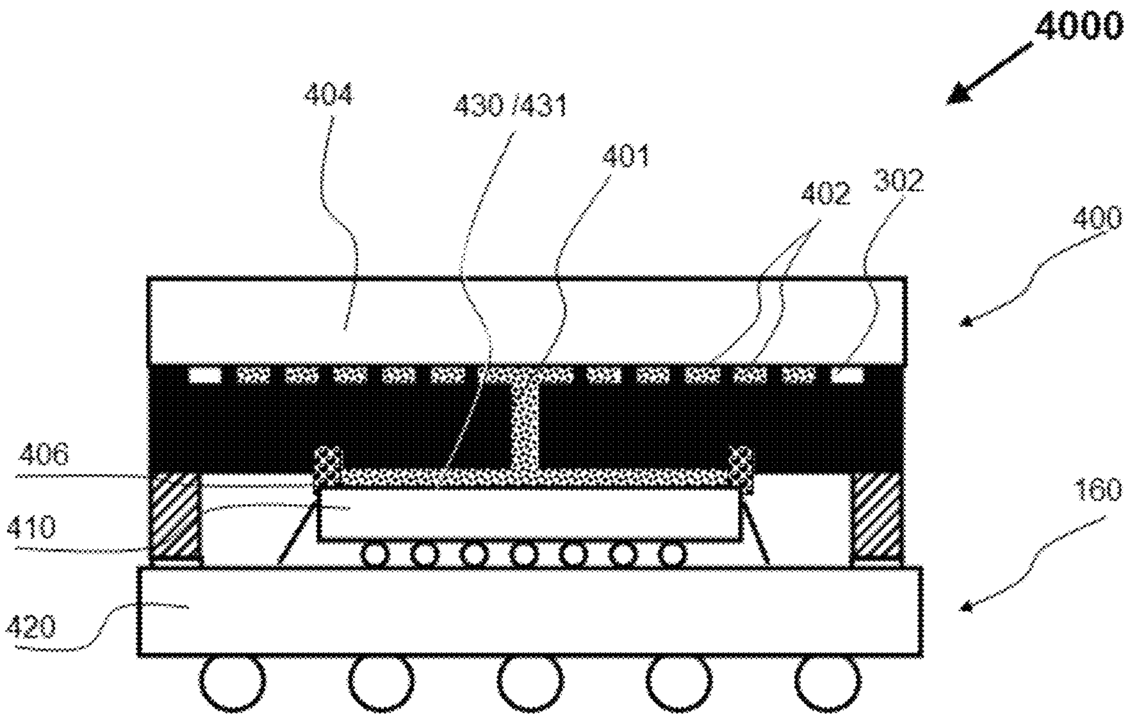
FIG. 8 and FIG. 8A are schematic diagrams for illustrating a lidded flip chip package with a liquid TIM based on the lid having a reservoir on its top surface of one preferred embodiment of the present invention.

FIG. 8 is a schematic diagram for illustrating a lidded flip chip package with a liquid TIM based on the lid having a reservoir on its top surface of one preferred embodiment of the present invention. The numerical symbol 4000 in FIG. 8 designates a lidded flip chip package with a liquid TIM, in which the 400, and 160 designate a lid and a flip chip package, the flip chip package 160 consists of a flip chip 410 and a substrate 420, the lid 400 is attached on the peripheral region of top surface of the substrate 420, covering the flip chip 410, the seal ring 406 seals the gap between the flip chip 410 and the lid 400, forming a sealed gap 430, the lid 400 includes a spiral pattern of slot 302 on its top surface for a reservoir, a removable covering piece 404 covers the spiral type of slot 402 for it to become a spiral pattern of tunnel, a liquid material is fully filled in the sealed gap 430 and partially filled in the spiral pattern of slot 302. The liquid material 431 in the sealed gap 430 forms a liquid TIM, thermally connecting the top surface of the flip chip 410 with the bottom surface of the lid 400, while the liquid material 402 partially filled in the spiral pattern of slot 302 can be used as a liquid TIM to connect the lid with a heat-dissipating object, like a heat sink, and the lid includes a connecting 401, which is between the sealed gap 430 and the spiral type of tunnel 302 for connecting one with the other.

Figure 8A:
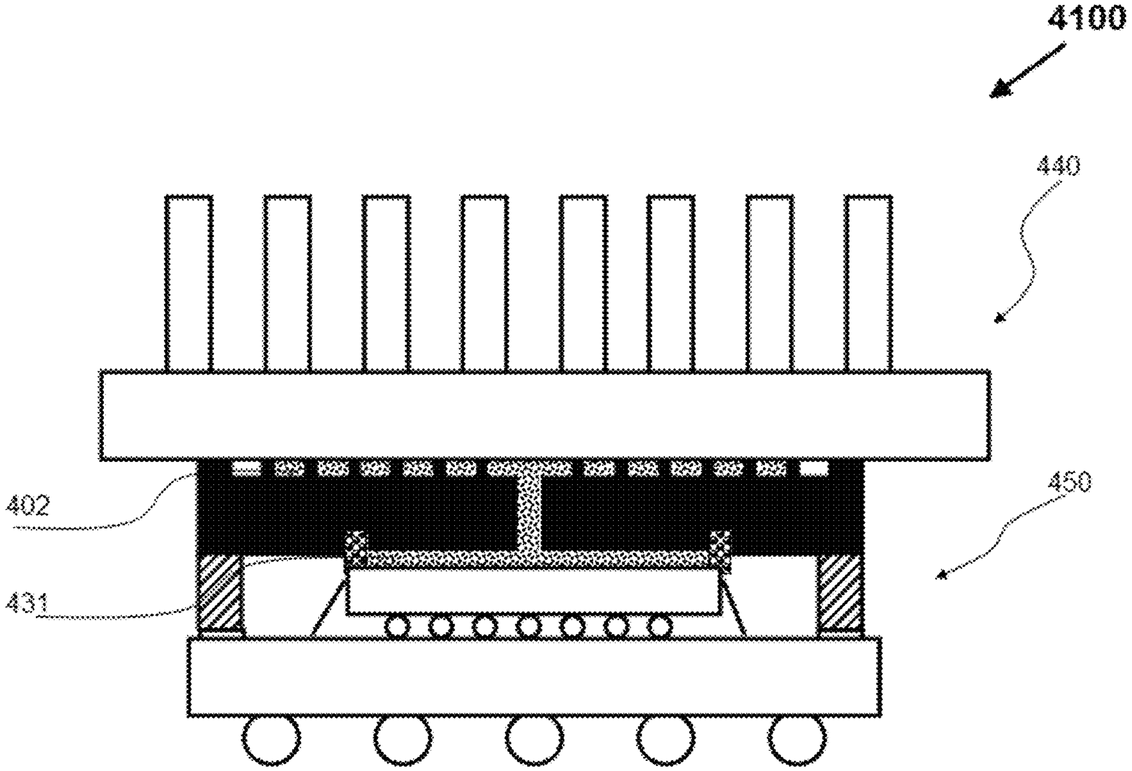

It is noted that the purpose for the lid or the lidded flip chip package to include the removable covering piece 404 as showed in FIG. 8 is for protecting the liquid material 402 in the spiral pattern of slots 302. As a result, the lidded flip chip package 4000 can be transported or tested without the concern for the leakage of the liquid material 402. In the field application of the lidded flip chip package 4000, the removable covering piece 404 can be replaced by a heat sink so that the liquid material 402 in the spiral pattern of slots 302 can be used as the TIM between the lid and the heat sink, which is illustrate by the schematic diagram 4100 in FIG. 8A, in which the 450 designates that the removable covering piece 404 in the lidded flip chip package 4000 in FIG. 8 is replaced by a heat sink 440. So, it is seen that a benefit from the lid having a reservoir on its top surface is that the same liquid material can be used for both TIM1 and TIM2 of the lidded flip chip package.

Figure 9:
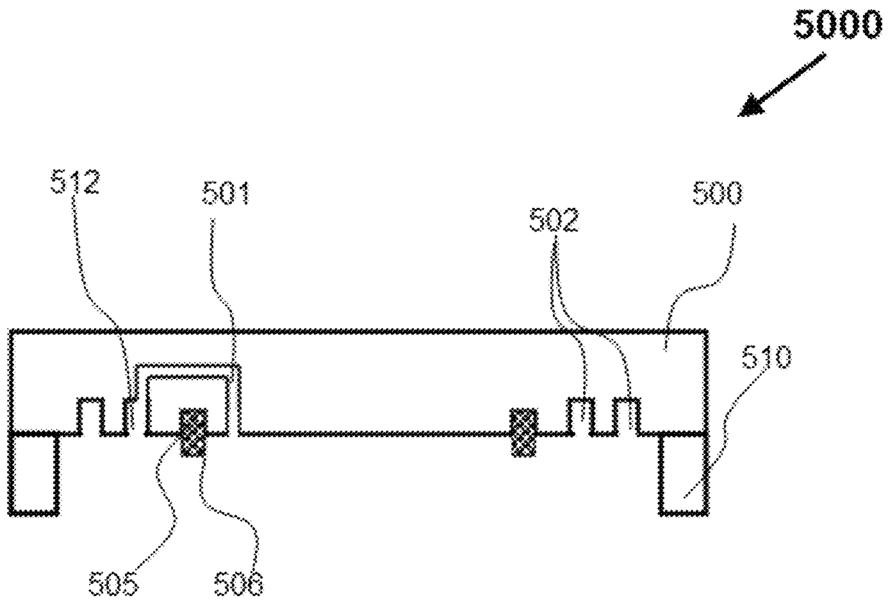
FIG. 9, FIG. 9A and FIG. 9B are schematic diagrams for illustrating a lid having a reservoir on its bottom surface from its cross-sectional and bottom views of one preferred embodiment of the present invention.
Figure 10:
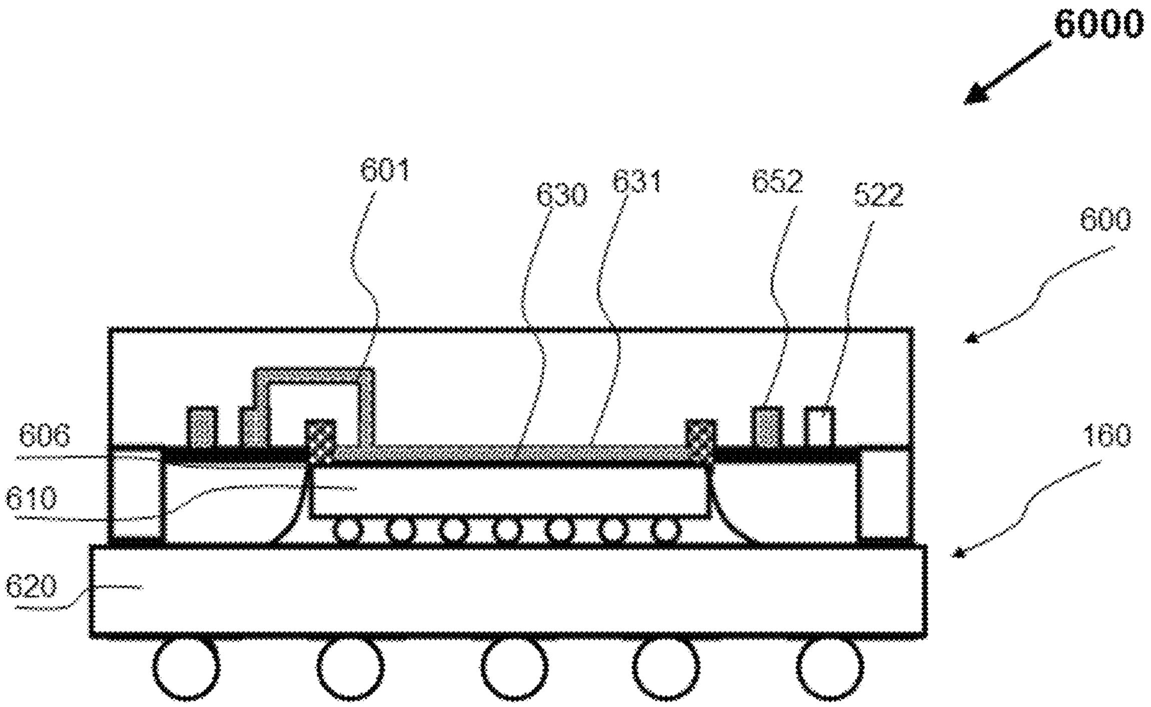
FIG. 10 is a schematic diagram for illustrating a lidded flip chip package with a liquid TIM based on the lid having a reservoir on its bottom surface of one preferred embodiment of the present invention.

FIG. 9 to FIG. 10 are schematic diagrams for illustrating a lid and its corresponding lidded flip chip package of another preferred embodiment of the present invention, in which the reservoir is formed on the bottom surface of the lid.

Figure 9A:
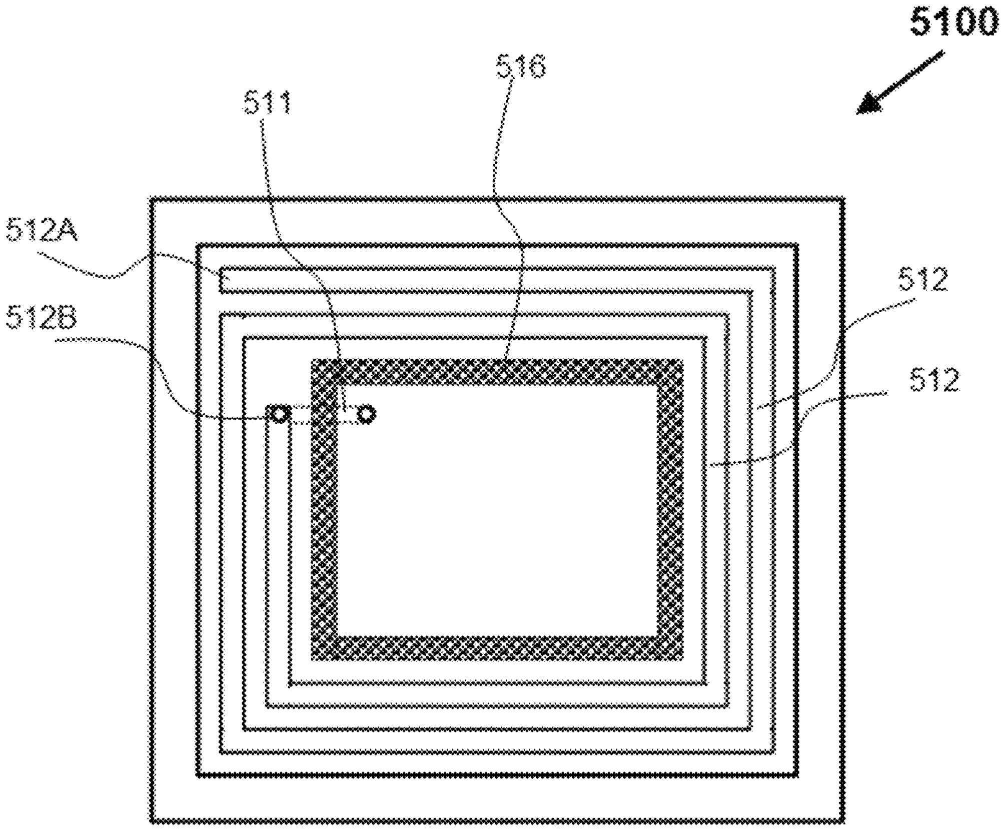
Figure 9B:
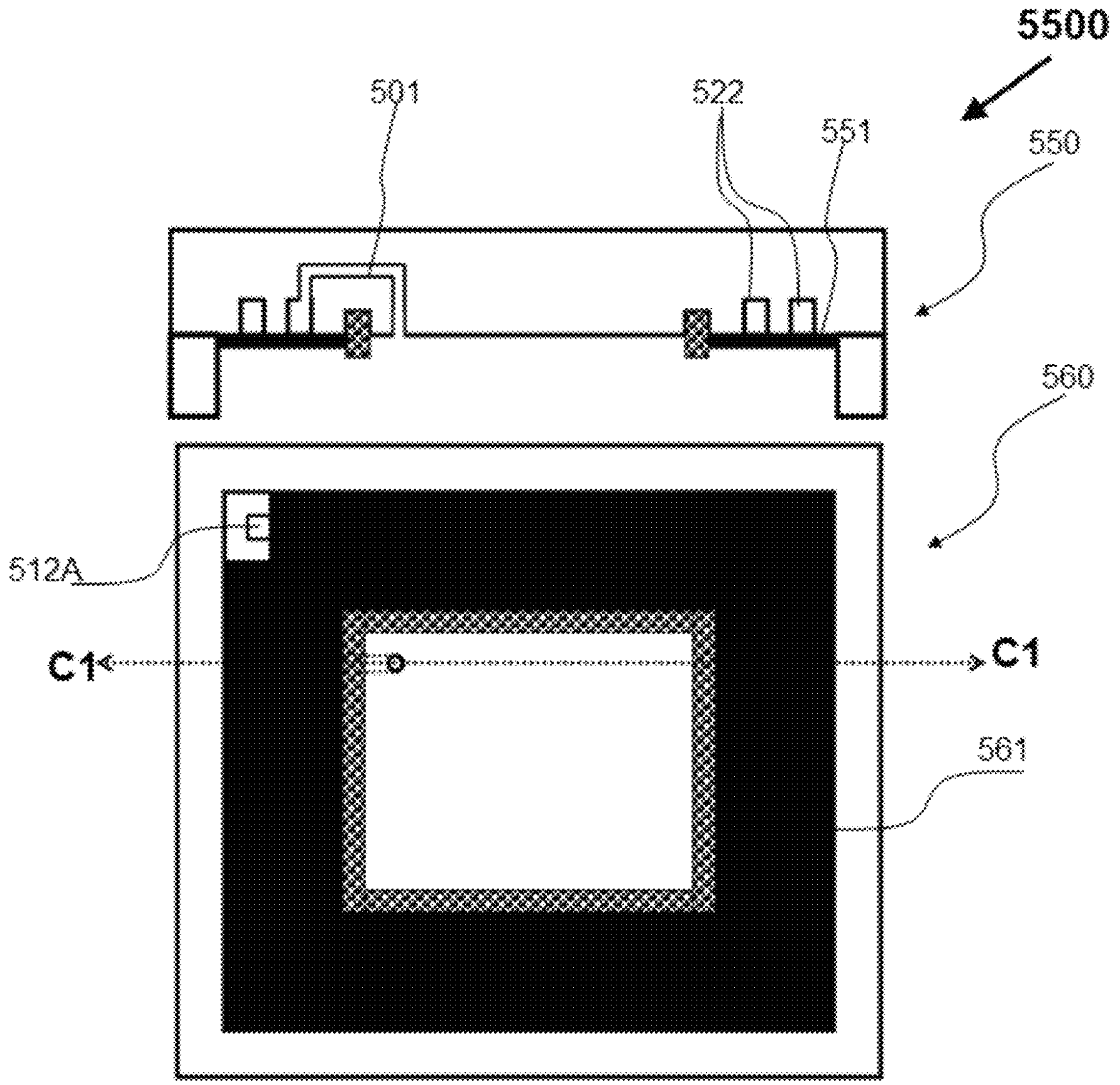

FIG. 9, FIG. 9A and FIG. 9B are schematic diagrams for illustrating the lid from its cross-sectional and bottom views. The numerical symbol 5000 in FIG. 8 designates the cross-sectional view of the lid, in which the 500 and 510 respectively designate the top piece and side wall of the lid, 505 and 506 respectively designate a ring-type of slot on the bottom surface of the top piece 500 and a seal ring mounted in the ring-type of slot 505, 502 designates a spiral pattern of slot on the bottom surface and around the seal ring region, 501 designate a curved connecting hole in the lid, starting from the seal ring region of bottom surface of the lid and going out to connect with the spiral pattern of slot 502, and 512 designates that the tunnel 501 connects with the spiral pattern of slot 502. The numerical symbol 5100 in FIG. 9A designates the bottom view of the lid, in which the 512 designates the spiral pattern of slot 502 in FIG. 9 from its bottom view, 512A and 512B designate the outlet and inlet of the spiral pattern of slot 512, 511 designate the connecting hole 501 from its bottom view, and the 516 designate the seal ring 506 from its bottom view. The numerical symbol 5500 in FIG. 9B designates that the lid 5000/5100 showed in FIG. 9/9A further includes a covering piece, in which the 550 and 560 designate the cross-sectional and bottom views of the lid, the 551 and 561 designate the covering piece from its cross-sectional and bottom views, which is bonded on the bottom surface of the lid, covering the spiral pattern of slot 502 as showed in FIG. 9 so that the slot 502 becomes a spiral pattern of tunnel 512. It is noted that the outlet 512A of the slot 512 should be opened to the ambient without being covered, and the arrow dash line C1 to C1 designates the cross-sectional location for the cross-sectional view 550 of the lid 5500.

FIG. 10 is a schematic diagram for illustrating a lidded flip chip package using the lid 5500 in FIG. 9, in which the numerical symbol 6000 designates the cross-sectional view of the lidded flip chip package, which comprises a flip chip package 160 and a lid 600, and a reservoir system, the flip chip package 160 includes a flip chip 610 and a substrate 620, the lid includes a seal ring 606 on the bottom surface of the lid, which seals the gap between the flip chip 610 and the lid 600, forming a sealed gap 630, the lid includes a reservoir, that is a spiral pattern of tunnel 522 on the bottom surface of the lid and around the sealed gap 630, a curved tunnel 601 connects the sealed gap 630 with the spiral pattern of tunnel 522, and a liquid material is fully filled in the sealed gap 630 and partially filled in the spiral pattern of tunnel 522, the 631 designates the liquid material filled in the sealed gap 630, forming the TIM between the flip chip 610 and the lid 600, and the 652 designates the liquid material partially filled in the spiral pattern of tunnel 522.

Figure 11:
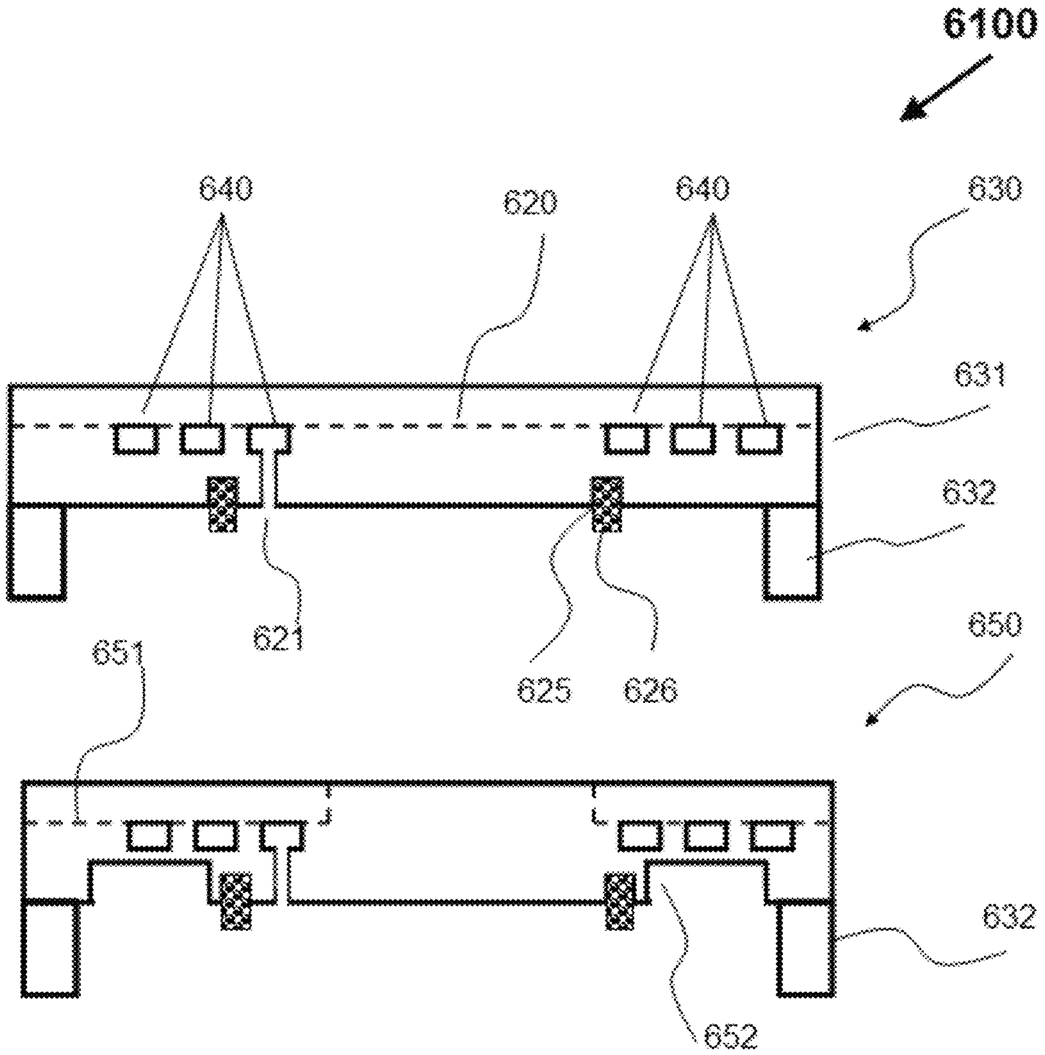
FIG. 11 is a schematic diagram for illustrating a lid having a pattern of tunnel in the middle layer of region of its top piece and a way for making it of one preferred embodiment of the present invention.

FIG. 11 is a schematic diagram for illustrating a lid having a pattern of tunnel in the middle layer region of the top piece of the lid and a way for making it of another preferred embodiment of the present invention. The lid designated by the numerical symbol 630 in FIG. 11 includes a top piece 631, a side wall 632, a seal ring 626 mounted in a ring-type of slot 625 on the bottom surface of the lid, a tunnel type of reservoir 640 inside the top piece 631, and a connecting hole 621, starting from the seal ring region of bottom surface and connecting to the reservoir. The dash line 620 in the lid 630 illustrates that the top piece 631 and the tunnel type of reservoir 640 are formed by bonding two pieces of metal together. Of the two piece of metal, the bottom one has a pattern of slots, which forms the tunnel type of reservoir 640 after being covered by the top piece of metal. It is noted that a tunnel type of reservoir on the top or bottom surface of a lid can be formed through cutting a slot on the top or bottom surface of a lid. The lid designated by the numerical symbol 650 in FIG. 11 illustrates some variations from the lid 630, in which the dash line 651 illustrates that the top piece of metal is a ring-type of piece, and the 652 illustrates a step type of cutting on the bottom surface of the lid and outside the seal ring region.

Figure 12:
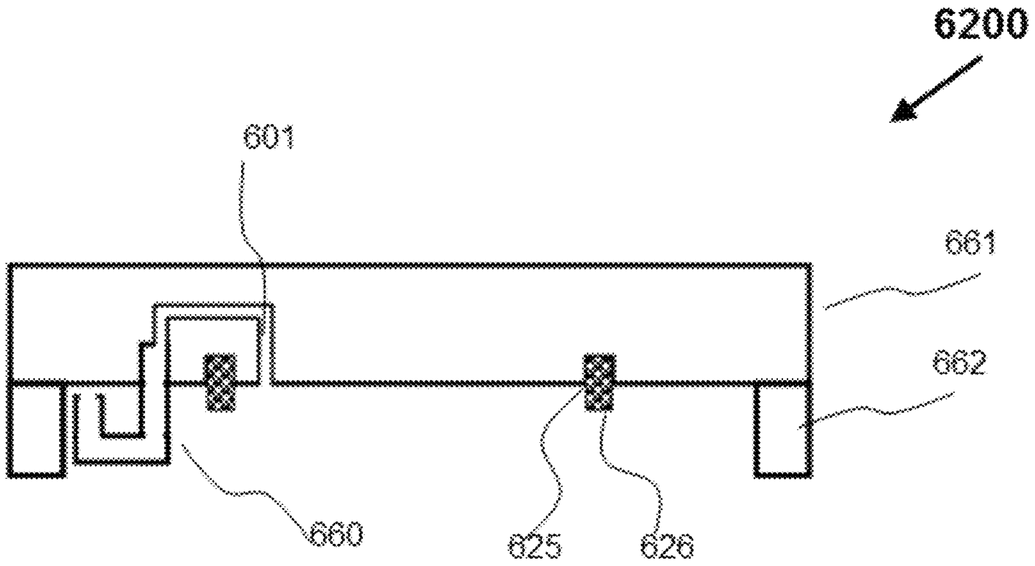
FIG. 12 is a schematic diagram for illustrating a lid having a reservoir outside the lid body of another preferred embodiment of the present invention.

FIG. 12 is a schematic diagram for illustrating a lid of one preferred embodiment of the present disclosure, in which the reservoir is a tube type of container outside the lid body. The lid designated by the numerical symbol 6200 in FIG. 12 includes a top piece 661, a side wall 662, a seal ring 626 arranged in a ring-type of slot 625 on the bottom surface of the lid, a tube type of reservoir 650 outside the lid body, and a connecting hole 601, starting from the seal ring region of bottom surface and connecting to the tube type of reservoir 650. It is noted that many variations can be designed for a container outside the lid body. For example, a lid has two connecting holes and a pump type of container having two tubes connects to the two connecting holes so that a liquid material can be circulated from the pump type of container, forming a dynamic TIM when applying the lid for a lidded flip chip package.

It is noted that according to the spirit and scope of the present disclosure, many other modifications and variations can be made. Some examples of the modifications and variations are given to further describe the present invention. The reservoir included in the lid is not limited to be one cavity and the number of the connecting hole is not limited to be one. A reservoir consisting of two tunnels with each being connected with one connecting hole is described as an example in FIG. 13. The lidded flip chip package with a liquid TIM is not limited to only include a single flip chip. A module consisting of multiple chips is described as an example in FIG. 14. A lidded flip chip package having multiple separate chips is described in FIG. 15. And a heat sink having a reservoir structure for a flip chip package to use a liquid TIM is described in FIG. 16.

Figure 13:
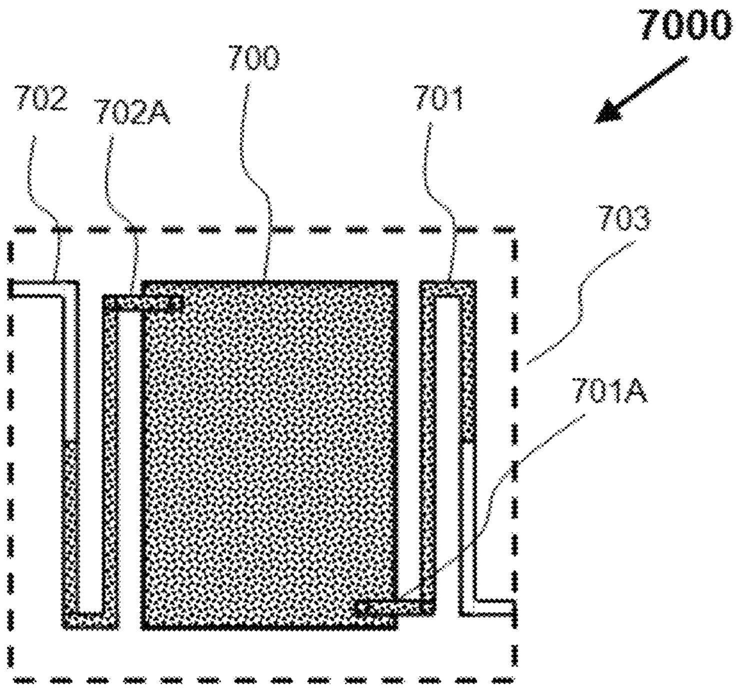
FIG. 13 is a schematic diagram for illustrating a reservoir system consisting of multiple tunnels and multiple connecting holes of another preferred embodiment of the present invention.

FIG. 13 is a schematic diagram for illustrating a reservoir in a lid and a reservoir system in an associated lidded flip chip package, wherein the reservoir consists of two tunnels. The numerical symbol 7000 in FIG. 13 designates a reservoir system, in which the 700 designates the sealed gap with a liquid TIM, the 701 and 702 designate two folding pattern of tunnels, forming a reservoir, 701A and 702A designate two connecting holes, each connecting one folding pattern of tunnel with the sealed gap 700, and the rectangular dash line illustrates the region of the top piece of the lid. It is noted that a benefit of such a reservoir system is that a liquid material can be injected into it from one tunnel without the need of a vacuum condition after the lid with the reservoir structure is attached to the flip chip package. Summarily, the reservoir included in the lid of present invention can be a cavity or particularly be one or more tunnels inside the lid, the one or more tunnels can be formed through one or more slots on the top or bottom surface of the top piece of the lid, the top piece of the lid can further comprises a reservoir layer, in which the reservoir is formed, referring to FIG. 3 to FIG. 13.

Figure 14:
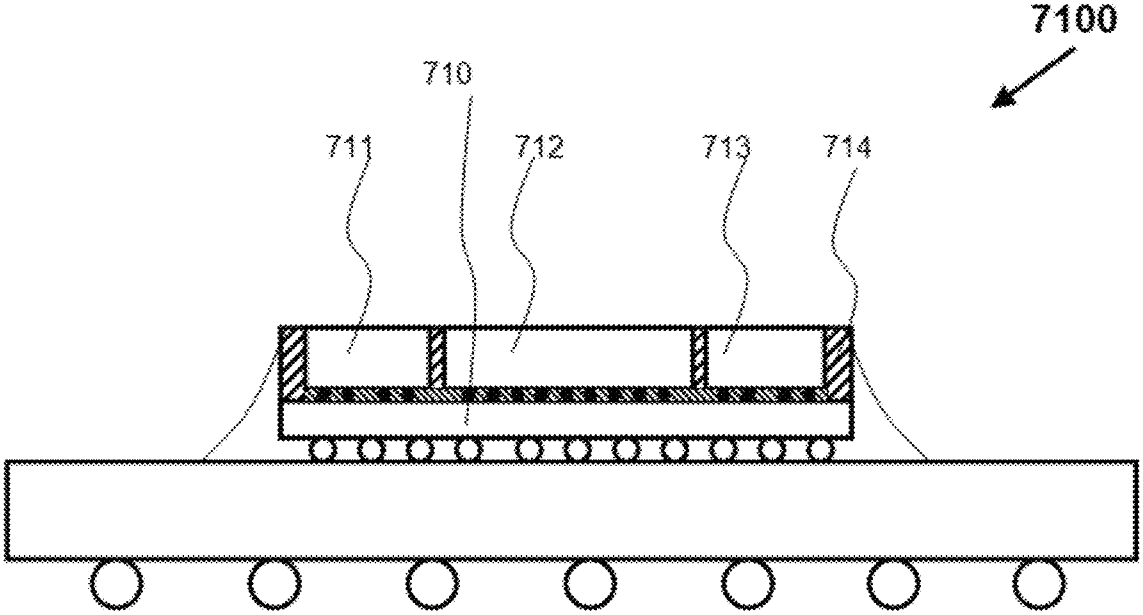
FIG. 14 is a schematic diagram for illustrating that a multiple chip module can be viewed as a single flip chip for the lidded flip chip package with a liquid TIM of one preferred embodiment of the present invention.

FIG. 14 is a schematic diagram for explaining the flip chip may be a module consisting of multiple chips in the scope of the present disclosure. The numerical symbol 7100 in FIG. 14 designates a module consisting of multiple chips, in which the multiple chips 711, 712 and 713 are integrated as a module through an interposer chip 710 and a molding material 714. When applying a lid of the embodiments of present invention to such a flip chip package to form a lidded flip chip package using a liquid TIM, the lid can be similarly applied by viewing the module as one chip. So, the flip chip in the scope of the present disclosure is not limited to a single chip, but includes the module with multiple chips or generally a heat-generating object with a continuous top surface.

Figure 15:
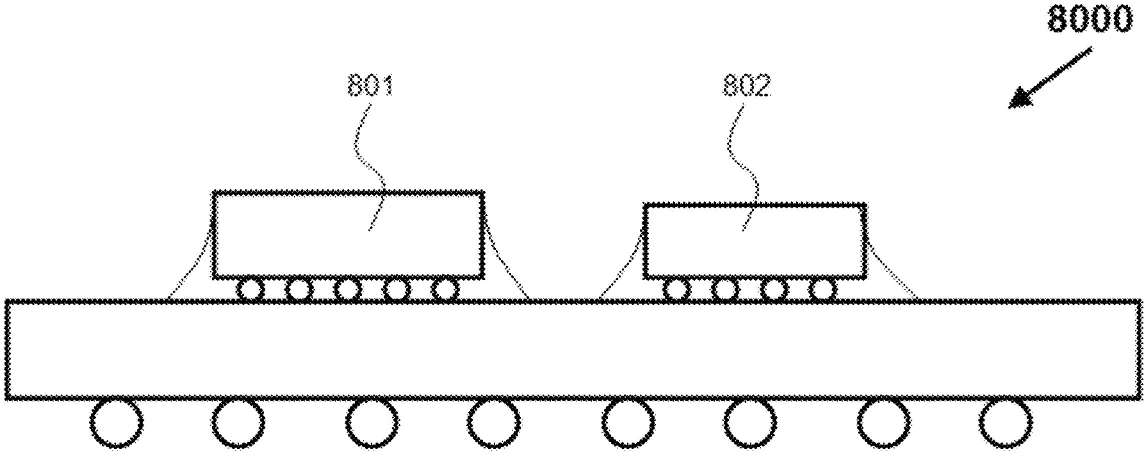
FIG. 15, FIG. 15A and FIG. 15B are schematic diagrams for illustrating a lidded flip chip package with a liquid TIM for the case of multiple flip chips of another preferred embodiment of the present invention.
Figure 15A:
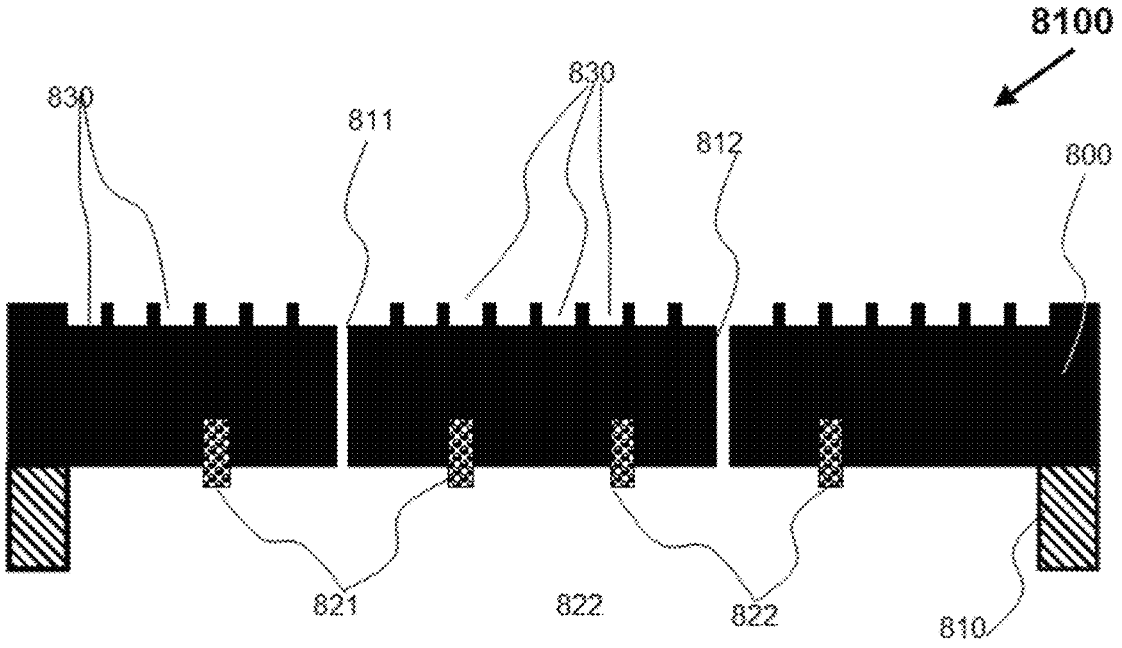
Figure 15B:
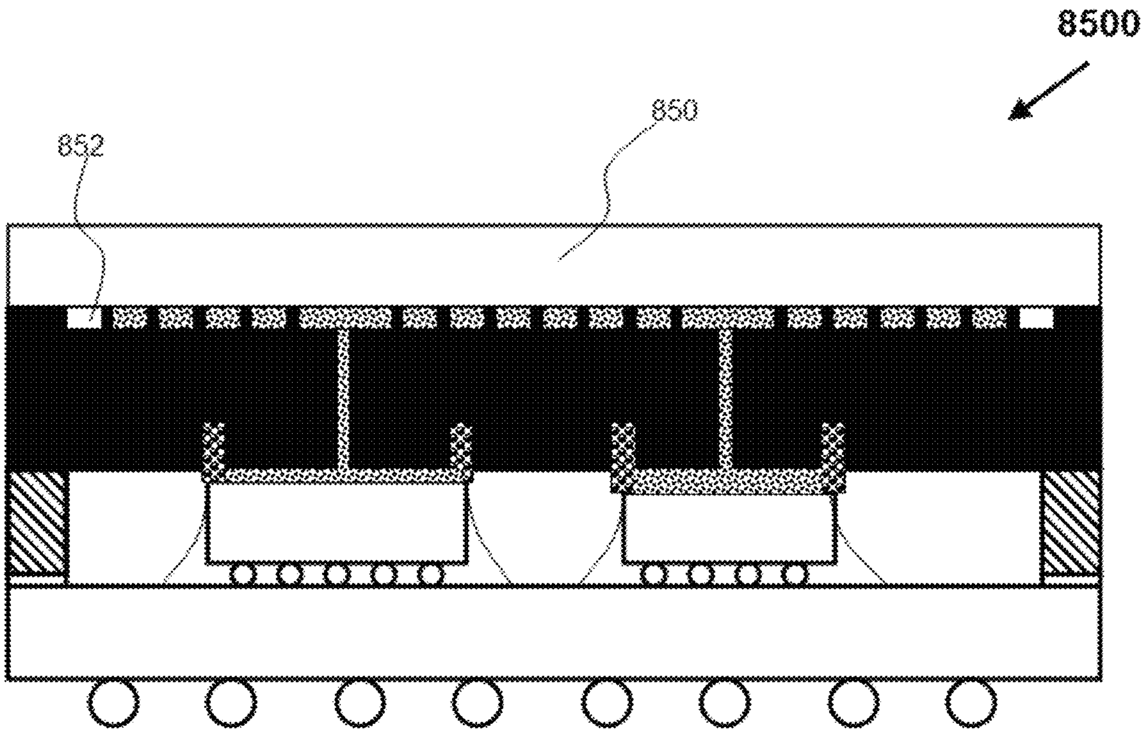

FIG. 15, FIG. 15A and FIG. 15B are schematic diagrams for illustrating the case of a lidded flip chip package having multiple separate chips of one embodiment of the present disclosure. The numerical symbol 8000 in FIG. 15 designates a flip chip package having multiple chips, in which the 801 and 802 designate the multiple chips. The numerical symbol 8100 in FIG. 15A designates the cross-sectional view of a lid according to the multiple chips 801 and 802 of the flip chip package 8000, in which the 800 and 810 respectively designate the top piece and side wall of the lid, 821 and 822 designate multiple seal rings 821 and 822 on the bottom surface of the top piece 800 according to the multiple chips 801 and 802, 830 designates a spiral pattern of slot on the top surface of the lid for forming a reservoir in its application for a lidded flip chip package, and for each seal ring, a connecting hole starts from the seal ring region of the bottom surface of the lid and connects to the spiral pattern of slot 830. The numerical symbol 8500 in FIG. 15B designates the cross-sectional view of a lidded flip chip package, which is formed by attaching the lid 8100 as showed in FIG. 15A to the flip chip package 8000 as showed in FIG. 15. In the lidded flip chip package, a removable covering piece 850 is attached to cover the spiral pattern of slot 830 in FIG. 15A, forming a spiral pattern of tunnel 852 as a reservoir, and a liquid material is fully filled in all the sealed gaps and partially filled in the spiral pattern of tunnel 852.

Figure 16:
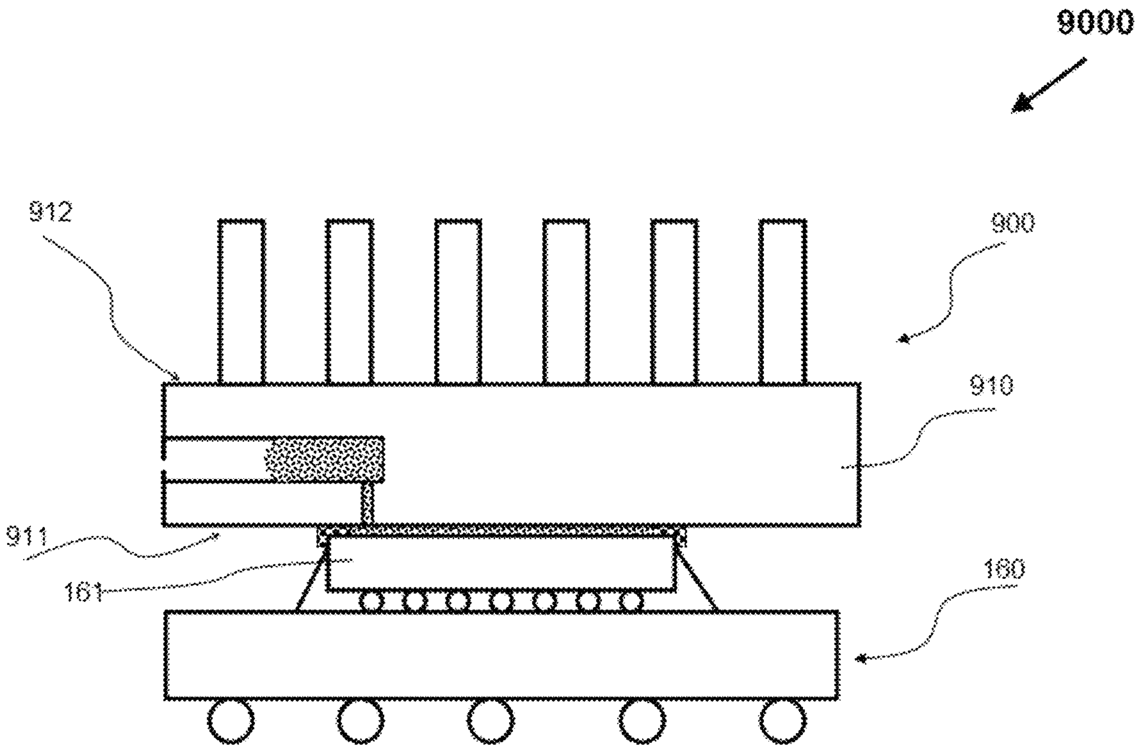
FIG. 16 is a schematic diagram for illustrating a heat sink having a reservoir structure for a flip chip package to use a liquid TIM of another preferred embodiment of the present invention.

FIG. 16 is a schematic diagram for illustrating a heat sink having a reservoir structure for a flip chip package to use a liquid TIM of another preferred embodiment of the present invention. The numerical symbol 9000 in FIG. 16 designates a heat sink having a reservoir structure for a flip chip package to use a liquid TIM, in which the numerical symbols 900 and 160 designate a heat sink having a reservoir structure and a flip chip package attached with the heat sink. As a result, a reservoir system is formed, giving a liquid TIM between the flip chip 161 and the base plate 910 of the heat sink, in which the 911 and 922 designate the bottom and top surface of the base plate 910, and 913 designates the fins on the top surface 912 of the base plate 910. The descriptions for the reservoir structure and the reservoir system can be referred to those in conjunction with the drawings in FIG. 3, and not repeated herein.

It is noted that even though a lid or a heat sink having a reservoir structure is specifically described in some details, the lid or heat sink should be generally understood as a heat-dissipating object according to the spirit and scope of the present invention. As the examples of the heat-dissipating objects, the lid and the heat sink have been described in conjunction with the drawings in FIG. 3 to FIG. 13 and FIG. 16. The top piece of the lid can be viewed as the base plate when generally viewing the lid as a heat-dissipating object. In an electronic device with a semiconductor chip as a heat-generating object, the heat-dissipating-object usually includes a lid, a heat sink, a vapor chamber and a heat pipe. These heat-dissipating objects commonly include a base plate having a top and bottom surface, and the bottom surface of the heat-dissipating objects contacts the top surface of the semiconductor chip through a TIM for spreading or dissipating the heat from the chip to the ambient or other heat-dissipating objects. So, the spirit and scope of the present invention is to couple a reservoir structure with a heat-dissipating object so that a reservoir system can be formed in an electronic device, allowing for a liquid TIM in the gap between the heat-dissipating object and the heat-generating object of the electronic device, and the reservoir of the lid or associated lidded flip chip package of the embodiments of the present invention described in conjunction with FIG. 3 to FIG. 13.

Although the present invention is described in some details for illustrative purpose with reference to the specific embodiments and drawings, it is apparent that many other modifications and variations may be made without departing from the spirit and scope of the present invention.

What is claimed is:

1. A lidded flip chip package with a liquid thermal interface material (TIM), comprising, a flip chip, a substrate having a top surface and a bottom surface, a lid including a top piece having a top surface and a bottom surface and a side wall, and a reservoir system, comprising a sealed gap, a reservoir, a connecting hole and a liquid material, wherein the flip chip is attached on the top surface of the substrate, forming a flip chip package, the lid is attached on the substrate by using an adhesive to bond its side wall onto a peripheral region of the top surface of the substrate, therein covering the flip chip and forming a gap between the flip chip and the top piece of the lid;

wherein the top piece of the lid has a slot on its bottom surface, a seal ring is mounted in the slot, the seal ring directly seals the gap between the flip chip and the lid along its peripheral region, forming the sealed gap, wherein the reservoir is a space in the top piece of the lid and around the seal ring, having an inlet and an outlet, a connecting hole has an end at a portion of the bottom surface of the top piece surrounded by the seal ring and another end connecting to the inlet of the reservoir, and the outlet of the reservoir opens to an ambient, and wherein the sealed gap is entirely filled with the liquid material, providing a liquid thermal interface material (TIM) between the lid and the flip chip, and the reservoir is partially filled with the liquid material.

2. The lidded flip chip package of claim 1, wherein the reservoir is one or more tunnels.

3. The lidded flip chip package of claim 1, wherein the reservoir is a spiral pattern of tunnel.

4. The lidded flip chip package of claim 1, wherein the top piece of the lid comprises a reservoir layer, which is a layer of material, in which the reservoir is formed.

5. The lidded flip chip package of claim 1, wherein the one or more tunnels are formed through one or more slots on the top or bottom surface of the top piece of the lid.

6. The lidded flip chip package of claim 1, wherein the one or more tunnels are formed through one or more slots on the bottom surface of the top piece of the lid and around the seal ring, and wherein the lid further comprises a covering piece which is bonded on the bottom surface of the top piece of the lid for covering said one or more slots, therein forming said one or more tunnels.

7. The lidded flip chip package of claim 1, wherein the one or more tunnels are formed through one or more slots on the top surface of the top piece of the lid, and wherein the lid further comprises a removable covering piece which covers said one or more slots on the top surface of the top piece of the lid, therein forming said one or more tunnels.

8. The lidded flip chip package of claim 1, wherein the one or more tunnels are formed through one or more slots on the top surface of the top piece of the lid and around the seal ring, and wherein the lid further comprises a covering piece which is bonded on the top surface of the top piece of the lid for covering said one or more slots, therein forming said one or more tunnels.

9. The lidded flip chip package of claim 1, wherein the flip chip is a chip module consisting of a plurality of chips.

10. The lidded flip chip package of claim 1, wherein the flip chip package comprises a plurality of separate flip chips and the lid accordingly comprises a plurality of seal rings.

11. A lidded flip chip package with a liquid thermal interface material (TIM), comprising, a flip chip, a substrate having a top surface and a bottom surface, a lid including a top piece having a top surface and a bottom surface and a side wall, and a reservoir system, comprising a sealed gap, a reservoir, a connecting hole and a liquid material, wherein the flip chip is attached on a middle region of the top surface of the substrate, forming a flip chip package, the lid is attached on the substrate by using an adhesive to bond its side wall onto a peripheral region of the top surface of the substrate, therein covering the flip chip and forming a gap between the flip chip and the top piece of the lid, wherein the top piece of the lid has a slot on its bottom surface, a seal ring is mounted in the slot, the seal ring directly seals the gap between the flip chip and the lid along its peripheral region, forming the sealed gap, wherein the reservoir is a container outside the lid, having an inlet and an outlet, a connecting hole has an end at a portion of the bottom surface of the top piece surrounded by the seal ring and another end connecting to the inlet of the reservoir, and the outlet of the reservoir opens to the ambient, and wherein the sealed gap is entirely filled with the liquid material, providing a liquid thermal interface material (TIM) between the lid and the flip chip, and the reservoir is partially filled with the liquid material.

12. The lidded flip chip package of claim 11, wherein the container is one or more tubes.

13. The lidded flip chip package of claim 11, wherein the container is a tube around the seal ring and between the top piece of the lid and the substrate.

* * * * *